United States Patent
Min et al.

(10) Patent No.: US 7,315,792 B2
(45) Date of Patent: Jan. 1, 2008

(54) TEMPERATURE DETECTOR PROVIDING MULTIPLE DETECTED TEMPERATURE POINTS USING SINGLE BRANCH AND METHOD OF DETECTING SHIFTED TEMPERATURE

(75) Inventors: Young-sun Min, Seoul (KR); Nam-jong Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/151,448

(22) Filed: Jun. 14, 2005

(65) Prior Publication Data

US 2005/0276144 A1 Dec. 15, 2005

(30) Foreign Application Priority Data

Jun. 14, 2004 (KR) .................. 10-2004-0043484

(51) Int. Cl.
*G01F 15/00* (2006.01)
(52) U.S. Cl. .................. 702/130; 702/99; 702/133; 374/102; 374/169; 327/512; 365/211; 377/25
(58) Field of Classification Search ......... 702/130, 702/85, 99, 133; 377/25, 49; 374/102, 170, 374/176–178, 169; 327/512–513; 365/211
See application file for complete search history.

(56) References Cited

U.S. PATENT DOCUMENTS

| | | | |
|---|---|---|---|
| 4,014,238 A | 3/1977 | Southard | |
| 4,395,139 A | 7/1983 | Namiki et al. | |
| 4,465,379 A | 8/1984 | Misawa et al. | |
| 5,025,248 A | 6/1991 | Bergeron | |
| 5,375,093 A | 12/1994 | Hirano | |
| 5,638,418 A | 6/1997 | Douglass et al. | |
| 5,739,593 A | 4/1998 | Hayama | |
| 5,795,069 A | 8/1998 | Mattes et al. | |
| 5,835,553 A | 11/1998 | Suzuki | |
| 5,875,142 A | 2/1999 | Chevallier | |
| 5,961,215 A | 10/1999 | Lee et al. | |
| 6,157,244 A | 12/2000 | Lee et al. | |
| 6,281,760 B1 | 8/2001 | Koelling et al. | |
| 6,299,347 B1 | 10/2001 | Pompei | |
| 6,316,988 B1 | 11/2001 | Forehand et al. | |
| 6,316,991 B1 | 11/2001 | Muyshondt et al. | |
| 6,320,809 B1 | 11/2001 | Raad | |
| 6,348,832 B1 | 2/2002 | Chih | |

(Continued)

FOREIGN PATENT DOCUMENTS

JP 2003297929 10/2003

(Continued)

*Primary Examiner*—John Barlow
*Assistant Examiner*—Hien Vo
(74) *Attorney, Agent, or Firm*—Volentine & Whitt, PLLC

(57) ABSTRACT

A temperature detector and method of detecting a shifted temperature provides multiple detected temperature points using a single branch. The temperature detector generates multiple detected temperature points in response to temperature control signals sequentially generated in a single branch. Since a shifted temperature for the single branch is found and a trimming operation in response to the shifted temperature is carried out, the test time is reduced. Various refresh periods can be set in response to various trip point temperatures and thus power consumption of a DRAM can be decreased.

22 Claims, 6 Drawing Sheets

U.S. PATENT DOCUMENTS

| | | |
|---|---|---|
| 6,489,831 B1 | 12/2002 | Matranga et al. |
| 6,504,420 B1 | 1/2003 | Vorenkamp et al. |
| 6,591,210 B1 | 7/2003 | Lorenz |
| 6,643,193 B2 | 11/2003 | Yamaki et al. |
| 6,667,925 B2 | 12/2003 | Kobayashi et al. |

FOREIGN PATENT DOCUMENTS

| | | |
|---|---|---|
| KR | 1020030056382 A | 7/2003 |
| KR | 2004-13885 | 2/2004 |

TEMPERATURE DETECTOR PROVIDING MULTIPLE DETECTED TEMPERATURE POINTS USING SINGLE BRANCH AND METHOD OF DETECTING SHIFTED TEMPERATURE

CROSS REFERENCES TO RELATED APPLICATIONS

This application claims priority under 35 U.S.C. §119 from Korean Patent Application No. 2004-43484, filed on Jun. 14, 2004, the contents of which are hereby incorporated by reference in their entirety for all purposes as if fully set forth herein.

BACKGROUND AND SUMMARY

1. Technical Field

The present invention relates to a temperature detector of a semiconductor circuit and, more particularly, to a temperature detector providing multiple detected temperature points using a single branch and a method of detecting a shifted temperature.

2. Description of the Related Art

One operating characteristic of a semiconductor device is its temperature characteristic. In the case of a CMOS device, the access time $t_{ACCESS}$ increases as temperature is increased (A) (and thus the operating speed of the device decreases), and current consumption IDD increases as the temperature is decreased (B), as shown in FIG. 1. The temperature characteristic is important to devices that require a refresh operation, such as a dynamic random access memory (DRAM). The DRAM is a volatile memory and requires a refresh operation. In a DRAM cell, leakage current is increased when the temperature is increased and thus the data retention characteristic is deteriorated and the data refresh period $t_{ST}$ is reduced.

Developments in electronics technology enable the design and cost-effective manufacturing of portable electronic devices, including pagers, cellular phones, audio players, calculators, lap-top computers, PDAs and so on. The portable electronic devices generally need DC power and thus at least one battery is used as an energy source for providing the DC power. In a battery-operated system, such as a portable electronic device, it is critically important to reduce power consumption. Particularly, in a sleep mode for saving power, circuit components included in the system are turned off. However, any DRAM included in the system should refresh DRAM cell data in order to continuously preserve the data.

One technique to reduce power required for a DRAM to operate is to vary the refresh period in response to temperature. Specifically, a temperature range is divided into multiple regions and the refresh period is increased in a low temperature region, that is, a refresh clock frequency is decreased, so as to reduce power consumption. Accordingly, a temperature detector is required to detect an internal temperature of the DRAM.

FIGS. 2A-B illustrate a conventional temperature detector. Referring to FIGS. 2A-B, a temperature detector 100 using a band gap reference circuit includes a plurality of branches 110, 120 and 130, PMOS transistors, and NMOS transistors. The temperature detector 100 further includes comparators 210, 220 and 230, which respectively compare temperatures OT1 through OTn, detected by the multiple branches 110, 120 and 130, with a reference temperature ORef.

The temperature detector 100 provides detected temperature points set to multiple specific temperatures. For instance, the first branch 110 may provide a detection point (or trip point) of 45° C. while the third branch 130 provides a detection point (or trip point) of 85° C.

The temperature detector 100 is very sensitive to variations in the semiconductor device manufacturing process. Thus, a temperature tuning operation for tuning a changed detection temperature point to a designed detection temperature point should be carried out for each DRAM chip at the wafer level. To perform temperature trimming during the temperature tuning operation, an operation of detecting a shifted temperature due to a variation in the manufacturing process must be carried out in advance.

FIG. 3 illustrates the distribution of shifted temperature detected from each chip in a lot, or batch, of chips. Referring to FIG. 3, when a refresh period, which is set when the temperature of a DRAM chip is in the range of 45° C. through 85° C., is 64 ms (X=64 ms), for example, the refresh period of the DRAM chip is set to half of 64 ms when the temperature is higher than 85° C. and three times 64 ms when the temperature is lower than 45° C.

However, when the temperature detector 100 employs the multiple branches 110, 120 and 130, the trip point of 45° C. of the first branch 110 may be shifted to a maximum of 50° C. and the trip point of 85° C. of the third branch 130 may be shifted to a minimum of 70° C. after the DRAM chip is manufactured. To tune the trip points, shifted to 50° C. and 70° C., to the desired set trip points, a separate trimming operation should be carried out for each branch. Accordingly, the temperature detector 100 requires a long period of time to detect a shifted temperature for each branch and to perform a trimming operation for the detected shifted temperature. Furthermore, the refresh period is varied by more than a factor of six, from three times the set refresh period to half the set refresh period in the range of 50° C. through 70° C.

Accordingly, it would be desirable to provide a temperature detector providing multiple trip points, or detection temperature points, using a single branch.

It would also be desirable to provide a method of detecting a shifted temperature using the temperature detector.

According to one aspect of the present invention, there is provided a temperature detector detecting a temperature shifted from a set target temperature, comprising an automatic pulse generator sequentially generating temperature control signals in response to a temperature detection signal; a comparator comparing detected temperatures with a predetermined reference temperature in response to the temperature control signals; a trip temperature increasing part comprising first short-circuiting switching transistors that selectively short-circuit a plurality of serially connected first binary weighted resistors in response to first test input signals and increasing the detected temperature when the shifted temperature is lower than the target temperature, the trip temperature increasing part being connected to a single branch; a trip temperature decreasing part comprising second short-circuiting switching transistors that selectively short-circuit a plurality of serially connected second binary weighted resistors in response to second test input signals and decreasing the detected temperature when the shifted temperature is higher than the target temperature, the trip temperature decreasing part being connected to the single branch; and a temperature detection controller selectively short-circuiting a plurality of serially connected resistors using third switching transistors in response to the temperature control signals to provide the detected temperatures, the temperature detection controller being connected to the single branch.

According to another aspect of the present invention, there is provided a method of detecting a shifted temperature that is changed from a set, target temperature, comprising sequentially generating temperature control signals in response to a temperature detection signal; selectively short-circuiting a plurality of serially connected resistors using switching transistors in response to the temperature control signals to provide detected temperatures, the switching transistors are being connected to a single branch; and comparing the detected temperatures with a predetermined reference temperature in response to the temperature control signals to search the shifted temperature.

Preferably, the shifted temperature detecting method further comprises increasing the detected temperatures using short-circuiting switching transistors that selectively short-circuit a plurality of serially connected binary weighted resistors in response to first test input signals when the shifted temperature is lower than the target temperature, and carrying out a trimming operation of short-circuiting the binary weighted resistors in response to the first test input signals obtained by binary weighted approximation. The short-circuiting switching transistors are connected to the single branch.

The shifted temperature detecting method further comprises decreasing the detected temperatures using short-circuiting switching transistors that selectively short-circuit a plurality of serially connected binary weighted resistors in response to second test input signals when the shifted temperature is higher than the target temperature, and carrying out a trimming operation of short-circuiting the binary weighted resistors in response to the second test input signals obtained by binary weighted approximation. The short-circuiting switching transistors being connected to the single branch.

According to the temperature detector of the present invention, the temperature detection controller connected to the single branch provides multiple trip point temperatures in response to the temperature control signals sequentially generated by the automatic pulse generator. Since a shifted temperature for the single branch is found and a trimming operation in response to the shifted temperature is carried out, test time is reduced. Furthermore, various refresh periods can be set in response to various trip point temperatures and thus consumption power of a DRAM can be decreased. The temperature detector of the present invention requires a layout area smaller than the layout area of the conventional temperature detector using multiple branches because the temperature detector of the present invention uses a single branch. Moreover, temperatures are shifted in the same direction such that 85° C. is shifted to 90° C. when 45° C. is shifted to 50° C. according to the temperature detector of the present invention. Thus, a stable refresh period is maintained even if the temperature is shifted.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
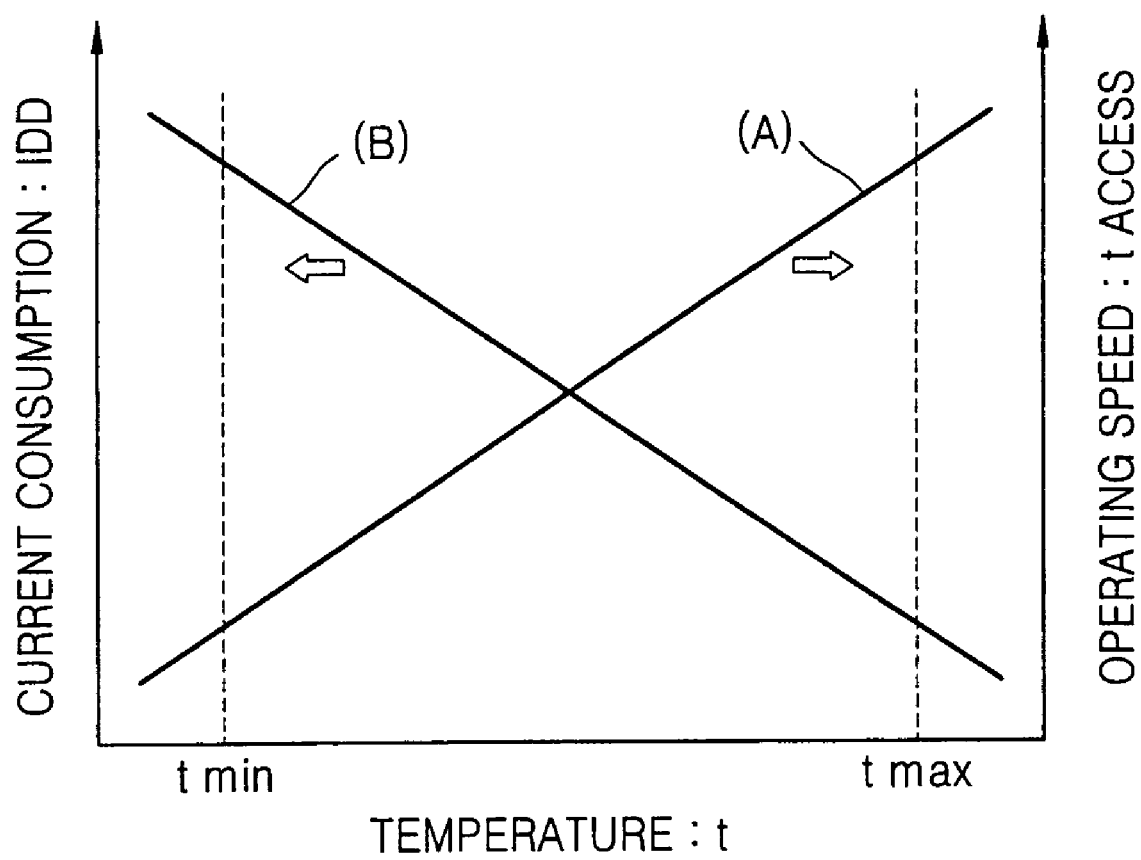
FIG. 1 illustrates temperature characteristics of a CMOS device.
Figure 2A:
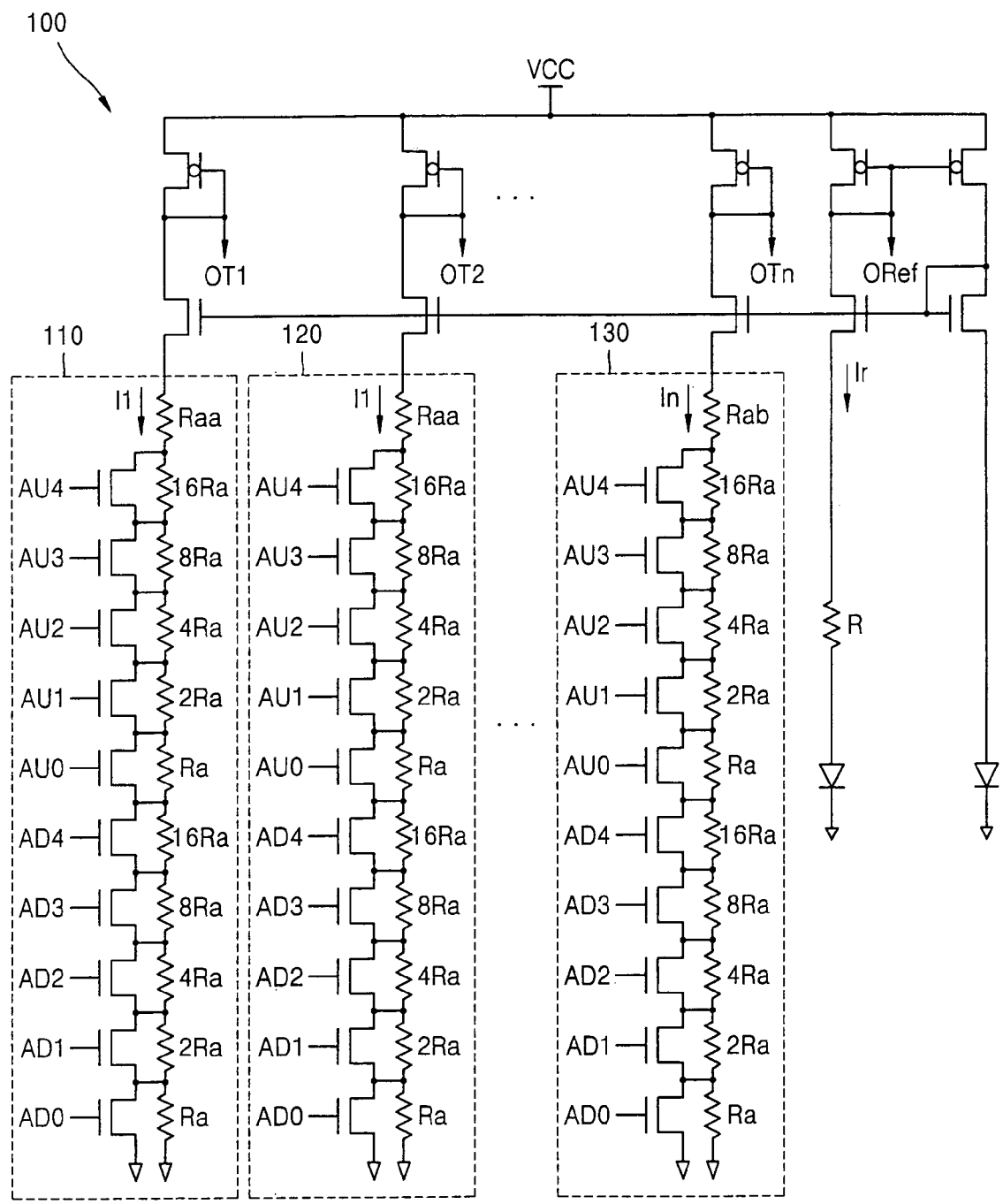
FIGS. 2A-B illustrate a conventional temperature detector.
Figure 2B:
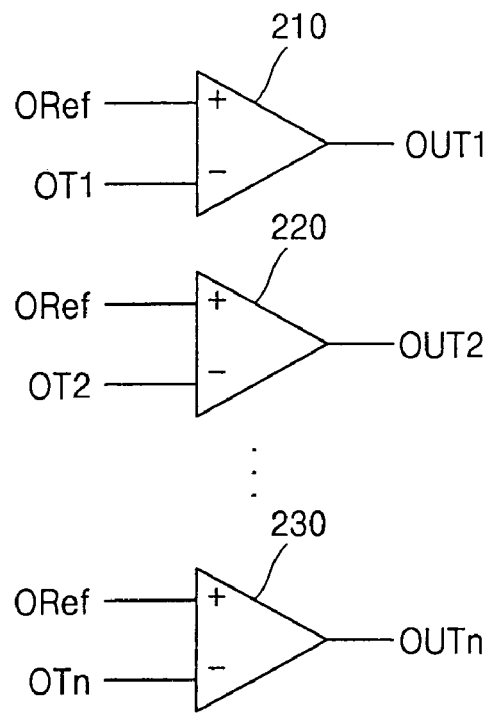

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

FIGS. 4A-D illustrate a temperature detector. The temperature detector includes a temperature detection unit 400 of FIG. 4A, an automatic pulse generator 500 of FIG. 4B, a comparator 600 of FIG. 4C, and registers 710, 720 and 730 of FIG. 4D.

Figure 4A:
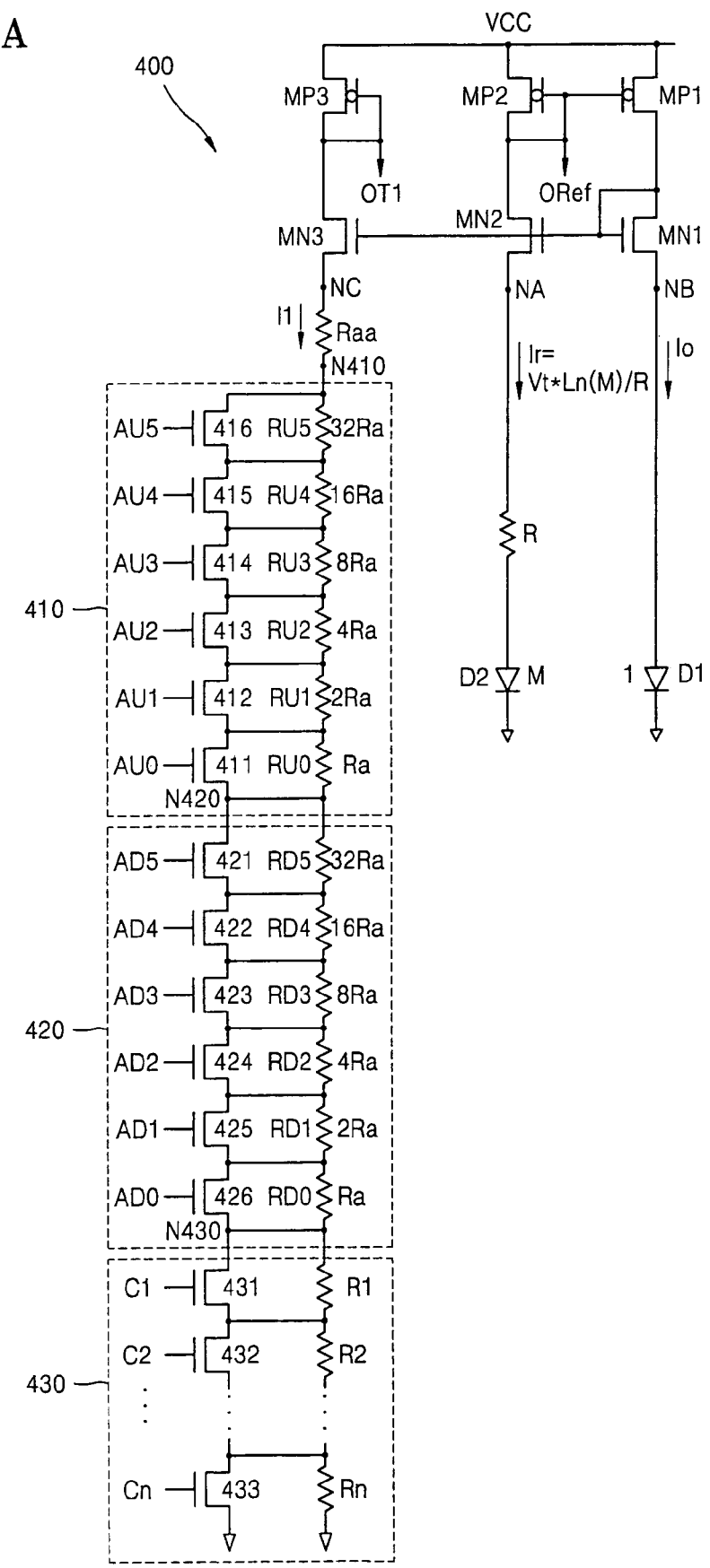
FIGS. 4A-D illustrate a temperature detector according to one or more aspects of the present invention.

Referring to FIG. 4A, the temperature detection unit 400 includes first, second and third PMOS transistors MP1, MP2 and MP3, first, second and third NMOS transistors MN1, MN2 and MN3, first and second diodes D1 and D2, a trip temperature increasing part 410, a trip temperature decreasing part 420, and a temperature detection controller 430.

The first, second and third PMOS transistors MP1, MP2 and MP3 have the same size as each other. That is, the first, second and third PMOS transistors MP1, MP2 and MP3 have the same channel length and width. The first, second and third NMOS transistors MN1, MN2 and MN3 also have the same size as each other. The ratio of the size of the first diode D1 to the size of the second diode D2 is 1:M.

The current Io and the current Ir are identical to each other according to current mirror of the first and second PMOS transistors MP1 and MP2 and the first and second NMOS transistors MN1 and MN2. That is, Io:Ir=1:1.

In the meantime, the turn-on current ID of a diode is as follows:

$$ID = Is \times (e^{VD/VT} - 1) \doteq Is \times (e^{VD/VT})  \quad \text{[Equation 1]}$$

Here, Is is the reverse saturation current of the diode, VD is the diode voltage, and VT is a temperature voltage represented by dT/q. Thus, the current Io flowing through the first diode D1 is as follows:

$$Io = Is_1 \times (e^{VD1/VT})  \quad \text{[Equation 2]}$$

In other words, the first diode voltage VD1 is represented by the following equation:

$$VD1 = VT \times \ln(Io/Is_1)  \quad \text{[Equation 3]}$$

In addition, the second diode voltage VD2 is represented by the following equation:

$$VD2 = VT \times \ln(Ir/Is_2) = VT \times \ln(Io/(M^*Is_1))  \quad \text{[Equation 4]}$$

Since the current Io is identical to the current Ir, the voltage VNA of the node NA is identical to the voltage VNB of the node NB. Thus, the following relationship is obtained:

$$VNA = VNB = VD1 = VD2 + Ir \times R  \quad \text{[Equation 5]}$$

When Equation 5 is replaced by Equations 3 and 4, the following equation is obtained:

$$VT \times \ln(Io/Is_1) = VT \times \ln(Io/(M^*Is_1)) + Ir \times R  \quad \text{[Equation 6]}$$

Thus, the current Ir is represented as follows:

$$Ir = VT \times \ln(M)/R \qquad \text{[Equation 7]}$$

Accordingly, the current Ir increases in proportion to temperature.

When the current I1 of the node NC is identical to the current Io, the voltage VNC of the node NC is identical to the voltage VNB of the node NB as follows:

$$VNC = VD1 = VT \times \ln(Io/Is_1) \qquad \text{[Equation 8]}$$

Here, as the temperature increases, the reverse saturation current $Is_1$ increases much more than the temperature voltage VT. Thus, the voltage of the node NC decreases as the temperature is increased. Accordingly, the current I1 decreases as the temperature increases.

Figure 5:
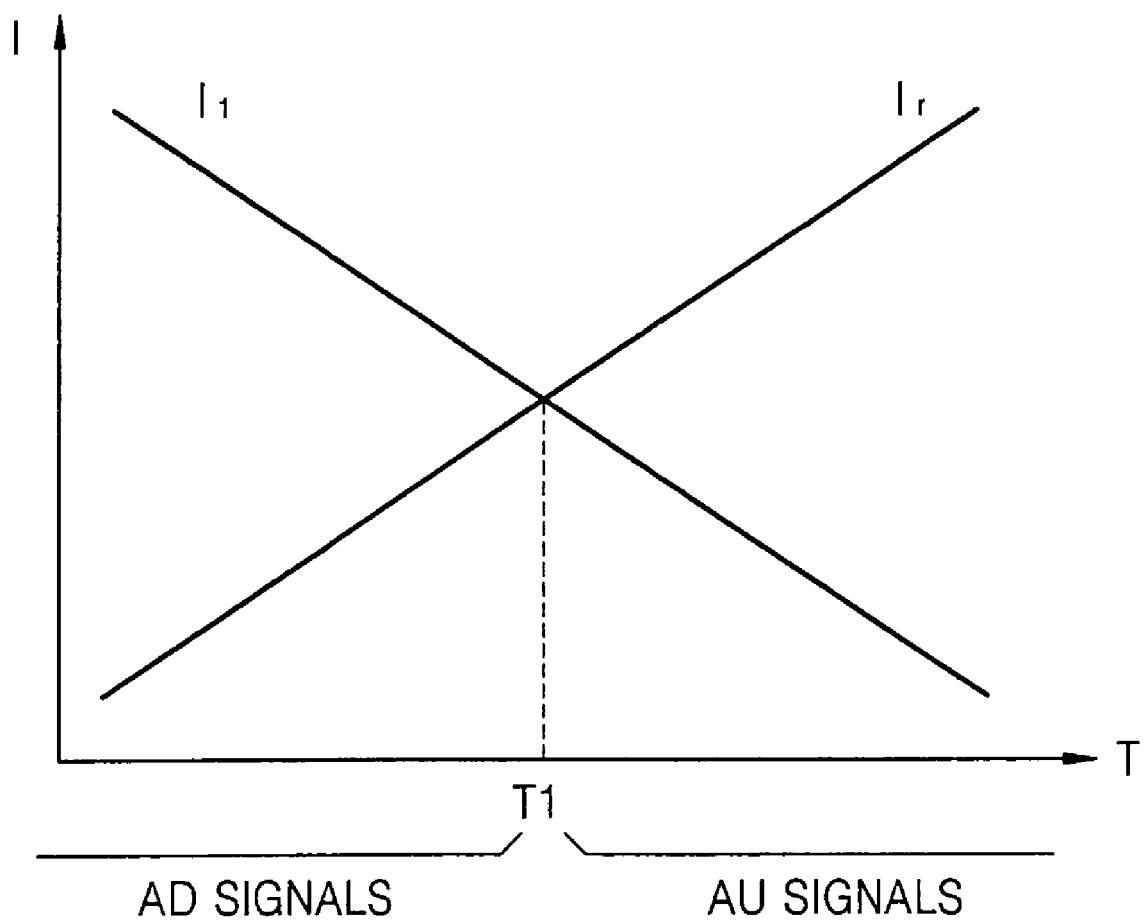
FIG. 5 is a graph for explaining a single detected temperature point set by the temperature detector of FIG. 4.

Therefore, the temperature detector 400 sets a specific temperature T1 at which the current Ir and the current I1 cross each other, shown in FIG. 5, as a trip point. In this embodiment, a single trip point is set to 45° C.

The trip temperature increasing part 410 includes first short-circuiting switching transistors 411 through 416, which selectively short-circuit a plurality of first binary weighted resistors RU0 through RU5 serially connected between nodes N410 and N420 in response to first test input signals AU0 through AU5, respectively. When the first test input signals AU0 through AU5 are in a normal state, AU5, AU4, AU3, AU2, AU1, AU0=0, 0, 0, 0, 0, 0 are input to the short-circuiting switching transistors 411 through 416 and thus the short-circuiting switching transistors 411 through 416 are turned off. Accordingly, all the binary weighted resistors RU0 through RU5 of the trip temperature increasing part 410 function as resistors. Subsequently, the first test input signals AU0 through AU5 are selectively changed to a logic high level to search for and set a trip point temperature.

The trip temperature decreasing part 420 includes second short-circuiting switching transistors 421 through 426, which selectively short-circuit a plurality of second binary weighted resistors RD0 through RD5 serially connected between the node N420 and a node N430 in response to second test input signals AD0 through AD5, respectively. When the second test input signals AD0 through AD5 are in a normal state, AD5, AD4, AD3, AD2, AD1, AD0=1, 1, 1, 1, 1, 1 are input to the short-circuiting switching transistors 421 through 426 and thus the short-circuiting switching transistors 421 through 426 are turned on. Accordingly, all the binary weighted resistors RD0 through RD5 of the trip temperature decreasing part 420 are short-circuited and do not function as resistors. Subsequently, the second test input signals AD0 through AD5 are selectively changed to a logic low level to search for and set a trip point temperature.

Beneficially, the binary weighted resistors RU0 through RU5 of the trip temperature increasing part 410 can have resistance values Ra, 2Ra, 4Ra, 8Ra, 16Ra and 32Ra, respectively, while the binary weighted resistors RD0 through RD5 of the trip temperature decreasing part 420 can also have resistance values Ra, 2Ra, 4Ra, 8Ra, 16Ra and 32Ra, respectively.

The temperature detection controller 430 includes switching transistors 431, 432 and 433, which selectively short-circuit a plurality of resistors R1 through Rn serially connected between the node N430 and ground voltage VSS in response to temperature control signals C1 through Cn. The temperature control signals C1 through Cn are sequentially generated by the automatic pulse generator 500 of FIG. 4B as explained below. The temperature control signals C1 through Cn are initially at a logic low level and then changed to a logic high level, or initially at a logic high level and then changed to a logic low level. The resistors R1 through Rn function as resistors when the respective temperature control signals C1 through Cn are at a logic low level, and the resistors R1 through Rn do not function as resistors when the respective temperature control signals C1 through Cn are at a logic high level. The resistors R1 through Rn can have resistance values Ra, 2Ra, 4Ra, 8Ra, . . . , nRa, respectively.

Figure 4B:
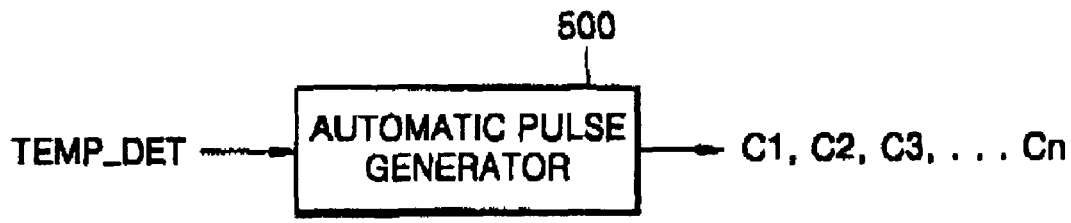
Figure 4C:
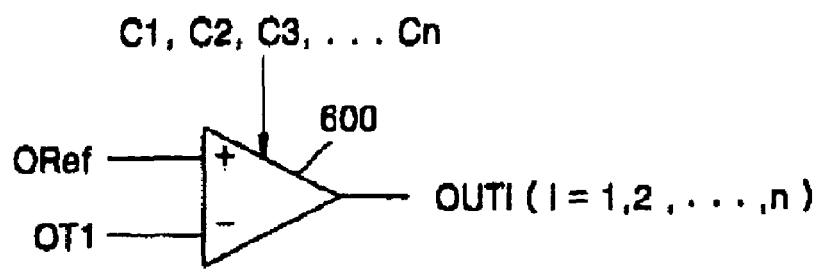
Figure 4D:
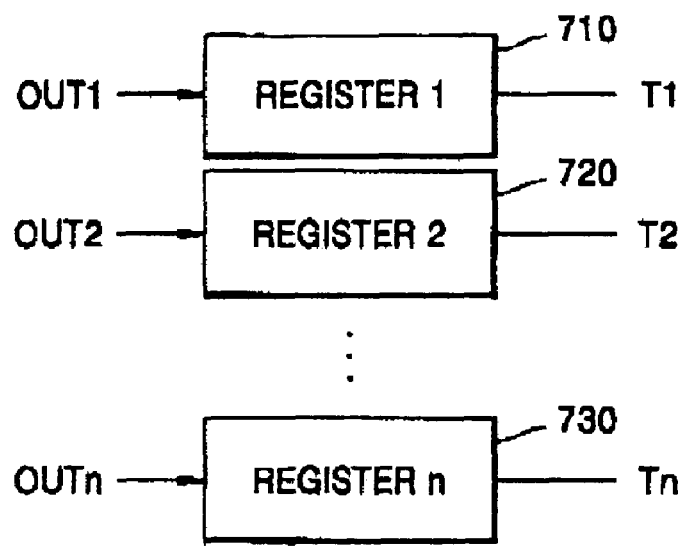

The temperature detection unit 400 is connected to the comparator 600 of FIG. 4C, which compares a temperature OT1 detected by the trip temperature increasing part 410, trip temperature decreasing part 420 and temperature detection controller 430, with the reference temperature ORef. The comparator 600 compares the detected temperature OT1 with the reference temperature ORef selectively in response to the temperature control signals C1 through Cn and outputs the comparison result OUTi (I=1, 2, . . . , n). The output signals OUTi of the comparator 600 are respectively stored in the registers 710, 720 and 730 of FIG. 4D.

The operation of the temperature detector of FIGS. 4A-D will now be explained.

The temperature detection controller 430 is operated after the trip temperature increasing part 410 and trip temperature decreasing part 420 are operated. Here, the comparator 600 of FIG. 4C is enabled.

The operation of the trip temperature increasing part 410 will now be described on the assumption that a test temperature is set to a fixed temperature 85° C. (ORef), a target trip point of the temperature detector is 45° C. and the trip point is shifted to 50° C. due to an error of 5° C. generated caused by a variation in manufacturing processes.

The comparator 600 compares the detected temperature OT1, 50° C., with the reference temperature ORef, 85° C., in response to AU5, AU4, AU3, AU2, AU1, AU0=0,0,0,0, 0,0, which are input to the trip temperature increasing part 410 in the normal state, and outputs a logic high level signal. When the signal AU5 is changed such that AU5, AU4, AU3, AU2, AU1, AU0=1,0,0,0,0,0 are input to the trip temperature increasing part 410, the comparator 600 compares a detected temperature OR1 of 82° C. with the reference temperature ORef of 85° C. and outputs a logic high level signal. When the signal AU4 is additionally changed such that AU5, AU4, AU3, AU2, AU1, AU0=1,1,0,0,0,0 are input to the trip temperature increasing part 410, the comparator 600 compares a detected temperature OR1 of 98° C. with the reference temperature ORef of 85° C. and outputs a logic low level signal.

Then, AU5, AU4, AU3, AU2, AU1, AU0=1,0,1,0,0,0 are input to the trip temperature increasing part 410, the comparator 600 compares a detected temperature OR1 of 90° C. with the reference temperature ORef of 85° C. and outputs a logic low level signal. When AU5, AU4, AU3, AU2, AU1, AU0=1,0,0,1,0,0 are input to the trip temperature increasing part 410, the comparator 600 compares a detected temperature OR1 of 86° C. with the reference temperature ORef of 85° C. and outputs a logic low level signal. When AU5, AU4, AU3, AU2, AU1, AU0=1,0,0,0,1,0 are input to the trip temperature increasing part 410, the comparator 600 compares a detected temperature OR1 of 84° C. with the reference temperature ORef of 85° C. and outputs a logic high level signal.

When AU5, AU4, AU3, AU2, AU1, AU0=1,0,0,0,1,1 are input to the trip temperature increasing part 410, the comparator 600 compares a detected temperature OR1 of 85° C. with the reference temperature ORef of 85° C. and outputs a signal vibrating between a logic high level and a logic low level. The finally changed values AU5, AU4, AU3, AU2, AU1, AU0=1,0,0,0,1,1 are stored in registers (not shown)

included in a test apparatus. The values 1,0,0,0,1,1 stored in the registers correspond to the decimal number 35. When 35° C. is subtracted from 85° C., 50° C. is obtained. Consequently, the shifted temperature of the temperature detector becomes 85° C.−35° C.=50° C. because the test temperature is 85° C. and the first test input signals AU0 through AU5, which are input to the trip temperature increasing part when the output signal of the comparator 600 vibrates, correspond to 35.

Next, the operation of the trip temperature decreasing part 420 to find the shifted temperature of 50° C. when the test temperature is set to a fixed temperature −5° C. will now be explained.

The comparator 600 compares a detected temperature OT1 of 50° C. with the reference temperature ORef of −5° C. in response to the second test input signals AD5, AD4, AD3, AD2, AD1, AD0=1,1,1,1,1,1, which are input to the trip temperature decreasing part 420 in the normal state, and outputs a logic low level signal. When the signal AD5 is changed to 0 such that AD5, AD4, AD3, AD2, AD1, AD0=0,1,1,1,1,1 are input to the trip temperature decreasing part 420, the comparator 600 compares a detected temperature OT1 of 18° C. with the reference temperature ORef of −5° C. and outputs a logic low level signal. When AD5, AD4, AD3, AD2, AD1, AD0=0,0,1,1,1,1 are input to the trip temperature decreasing part 420, the comparator 600 compares a detected temperature OT1 of 2° C. (=18−16) with the reference temperature ORef of −5° C. and outputs a logic low level signal. When AD5, AD4, AD3, AD2, AD1, AD0=0,0,0,1,1,1 are input to the trip temperature decreasing part 420, the comparator 600 compares a detected temperature OT1 of −6° C. (=2−8) with the reference temperature ORef of −5° C. and outputs a logic high level signal.

When AD5, AD4, AD3, AD2, AD1, AD0=0,0,1,0,1,1 are input to the trip temperature decreasing part 420, the comparator 600 compares a detected temperature OT1 of −2° C. (=2−4) with the reference temperature ORef of −5° C. and outputs a logic low level signal. When AD5, AD4, AD3, AD2, AD1, AD0=0,0,1,0,0,1 are input to the trip temperature decreasing part 420, the comparator 600 compares a detected temperature OT1 of −4° C. (=−2−2) with the reference temperature ORef of −5° C. and outputs a logic low level signal.

When AD5, AD4, AD3, AD2, AD1, AD0=0,0,1,0,0,0 are input to the trip temperature decreasing part 420, the comparator 600 compares a detected temperature OT1 of −5° C. (=−4−1) with the reference temperature ORef of −5° C. and outputs a signal vibrating between a logic low level and a logic low high signal. The finally changed values AD5, AD4, AD3, AD2, AD1, AD0=0,0,1,0,0,0 are inverted and the inverted values 1,1,0,1,1,1 are stored in registers (not shown) included in the test apparatus. The values 1,1,0,1,1,1 stored in the registers correspond to the decimal number 55. Thus, 55° C. is added to −5° C. to obtain 50° C. Consequently, the shifted temperature of the temperature detector is −5° C.+55° C.=50° C. because the test temperature is −5° C. and the second test input signal AD0 through AD5, which are input to the trip temperature decreasing part when the output signal of the comparator 600 vibrates, correspond to 55.

The shifted temperature detected by the trip temperature increasing part 410 or trip temperature decreasing part 420 allows a temperature trimming part (not shown) to selectively short-circuit the first binary weighted resistors RU0 through RU5 and the second binary weighted resistors RD0 through RD5. Accordingly, the temperature detector is operated at the originally designed trip point temperature, 45° C., in the normal state.

As described above, the temperature detector is basically operated at the set trip point temperature of 45° C. according to the operations of the trip temperature increasing part 410 and trip temperature decreasing part 420. A temperature detection signal TEMP_DET is periodically activated to enable the automatic pulse generator 500 as shown in FIG. 4B. In response to the temperature detection signal TEMP_DET, the automatic pulse generator 500 sequentially generates the temperature control signals C1 through Cn. The temperature detection controller 430 provides detected temperature OT1 in response to the temperature control signals C1 through Cn. The comparator 600 generates trip point temperatures T1 through Tn by comparing the detected temperature OT1 and the reference temperature ORef in response to the temperature control signals C1 through Cn, and stores the trip point temperatures in the registers 710, 720, . . . through 730.

Figure 3:
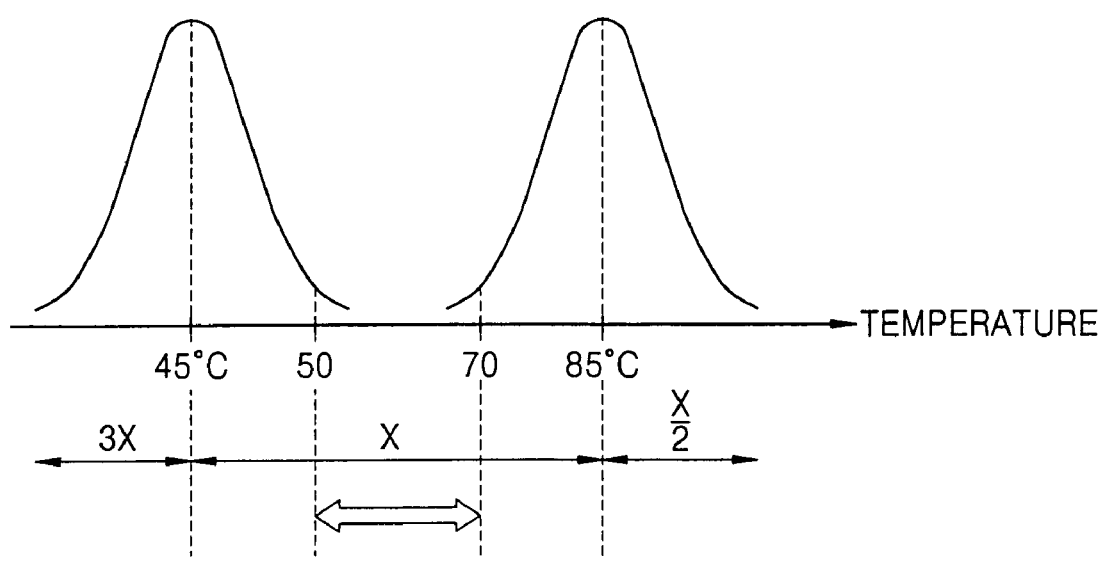
FIG. 3 illustrates the distribution of a shifted temperature detected from a chip.

The multiple trip point temperatures T1 through Tn provided in response to the temperature control signals C1 through Cn are more useful when the originally set temperature is not found due to various reasons, even when a temperature detection test is finished. That is, even if the temperature detector is initially set to 45° C./85° C., for example, the trip temperature of the devices has a Gaussian distribution with 45° C./85° C. in the center when the trip temperature is measured after packaging the devices, because characteristics of resistors and transistors are changed due to various tests or the power supply voltage is varied. In this case, the conventional temperature detector has the problem that the refresh period is varied by a ratio of more than 6:1, from three times the set refresh period to half of the set refresh period across the range from 50° C. through 70° C., as shown in FIG. 3. In the temperature detector of FIGS. 4A-D, however, the refresh period is changed from three times the set refresh period to half of the set refresh period across the range from 45° C. through 85° C., because temperatures are shifted in the same direction such that 85° C. is shifted to 90° C. when 45° C. is shifted to 50° C. This is because the temperature detector of FIGS. 4A-D uses a single branch. Accordingly, a stable refresh period is maintained even if the temperature is shifted.

Therefore, the temperature detector provides the multiple trip point temperatures T1 through Tn using the trip temperature increasing part 410, trip temperature decreasing part 420 and temperature detection controller 430, which are connected in a single branch.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A temperature detector detecting a temperature shifted from a set target temperature, comprising:
an automatic pulse generator adapted to sequentially generate temperature control signals in response to a temperature detection signal;
a comparator adapted to compare detected temperatures with a reference temperature in response to the temperature control signals; and
a temperature detection controller adapted to selectively short-circuit a plurality of serially connected resistors using switching transistors in response to the temperature control signals to provide the detected temperatures, the temperature detection controller being connected in a single branch.

2. The temperature detector as claimed in claim 1, further comprising registers storing outputs of the comparator and the detected temperatures.

3. The temperature detector of claim 1, further comprising a trip temperature increasing part connected to the single branch, the trip temperature increasing part comprising short-circuiting switching transistors for selectively short-circuiting a plurality of serially connected binary weighted resistors in response to first test input signals and increasing the detected temperature when the shifted temperature is lower than the target temperature.

4. The temperature detector of claim 3, wherein the trip temperature increasing part short-circuits the binary weighted resistors using binary weighted approximation.

5. The temperature detector of claim 4, further comprising a temperature trimming part adapted to short-circuit the binary weighted resistors in response to the first test input signals obtained by the binary weighted approximation.

6. The temperature detector of claim 1, further comprising a trip temperature decreasing part connected to the single branch, the trip temperature decreasing part comprising short-circuiting switching transistors adapted to selectively short-circuit a plurality of serially connected binary weighted resistors in response to second test input signals and to decrease the detected temperature when the shifted temperature is higher than the target temperature.

7. The temperature detector of claim 6, wherein the trip temperature decreasing part short-circuits the binary weighted resistors using binary weighted approximation.

8. The temperature detector of claim 4, further comprising a temperature trimming part that short-circuits the binary weighted resistors in response to the second test input signals obtained by the binary weighted approximation.

9. A temperature detector detecting a temperature shifted from a set target temperature, comprising:
    an automatic pulse generator adapted to sequentially generate temperature control signals in response to a temperature detection signal;
    a comparator adapted to compare detected temperatures with a predetermined reference temperature in response to the temperature control signals;
    a trip temperature increasing part comprising first short-circuiting switching transistors adapted to selectively short-circuit a plurality of serially connected first binary weighted resistors in response to first test input signals and to increase the detected temperature when the shifted temperature is lower than the target temperature, the trip temperature increasing part being connected in a single branch;
    a trip temperature decreasing part comprising second short-circuiting switching transistors adapted to selectively short-circuit a plurality of serially connected second binary weighted resistors in response to second test input signals and to decrease the detected temperature when the shifted temperature is higher than the target temperature, the trip temperature decreasing part being connected in the single branch; and
    a temperature detection controller adapted to selectively short-circuit a plurality of serially connected resistors using third switching transistors in response to the temperature control signals to provide the detected temperatures, the temperature detection controller being connected to the single branch.

10. The temperature detector of claim 9, further comprising registers adapted to store outputs of the comparator and the detected temperatures.

11. The temperature detector of claim 9, wherein the trip temperature increasing part is adapted to short-circuit the first binary weighted resistors using binary weighted approximation.

12. The temperature detector of claim 11, further comprising a temperature trimming part adapted to short-circuit the first binary weighted resistors in response to the first test input signals obtained by the binary weighted approximation.

13. The temperature detector of claim 9, wherein the trip temperature decreasing part is adapted to short-circuit the second binary weighted resistors using binary weighted approximation.

14. The temperature detector of claim 13, further comprising a temperature trimming part adapted to short-circuit the second binary weighted resistors in response to the second test input signals obtained by the binary weighted approximation.

15. A method of detecting a temperature shifted from a set target temperature, comprising:
    sequentially generating temperature control signals in response to a temperature detection signal;
    selectively short-circuiting a plurality of serially connected resistors using switching transistors in response to the temperature control signals to provide detected temperatures, the switching transistors are being connected in a single branch; and
    comparing the detected temperatures with a predetermined reference temperature in response to the temperature control signals to determine the shifted temperature.

16. The method of claim 15, further comprising storing the comparison result and the detected temperatures.

17. The method of claim 15, further comprising increasing the detected temperatures using short-circuiting switching transistors that selectively short-circuit a plurality of serially connected binary weighted resistors in response to first test input signals when the shifted temperature is lower than the target temperature, the short-circuiting switching transistors being connected in the single branch.

18. The method of claim 17, wherein the binary weighted resistors are short-circuited using binary weighted approximation.

19. The method of claim 18, further comprising carrying out a trimming operation of short-circuiting the binary weighted resistors in response to the first test input signals obtained by the binary weighted approximation.

20. The method of claim 15, further comprising decreasing the detected temperatures using short-circuiting switching transistors that selectively short-circuit a plurality of serially connected binary weighted resistors in response to second test input signals when the shifted temperature is higher than the target temperature, the short-circuiting switching transistors being connected to the single branch.

21. The method of claim 20, wherein the binary weighted resistors are short-circuited using binary weighted approximation.

22. The method of claim 21, further comprising carrying out a trimming operation by short-circuiting the binary weighted resistors in response to the second test input signals obtained by the binary weighted approximation.

* * * * *